(12) United States Patent
Abramzon

(10) Patent No.: US 10,444,785 B2
(45) Date of Patent: Oct. 15, 2019

(54) COMPACT AND ACCURATE QUADRATURE CLOCK GENERATION CIRCUITS

(71) Applicant: Samsung Display Co., Ltd., Yongin-si, Gyeonggi-do (KR)

(72) Inventor: Valentin Abramzon, Mountain View, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/109,656

(22) Filed: Aug. 22, 2018

(65) Prior Publication Data

US 2019/0286186 A1    Sep. 19, 2019

Related U.S. Application Data

(60) Provisional application No. 62/643,625, filed on Mar. 15, 2018.

(51) Int. Cl.
| | | |
|---|---|---|
| *G06F 1/06* | (2006.01) | |
| *H03K 5/01* | (2006.01) | |
| *H03H 7/06* | (2006.01) | |

(52) U.S. Cl.
CPC .............. *G06F 1/06* (2013.01); *H03H 7/06* (2013.01); *H03K 5/01* (2013.01)

(58) Field of Classification Search
None
See application file for complete search history.

(56) References Cited

U.S. PATENT DOCUMENTS

| | | | |
|---|---|---|---|
| 4,475,088 A | 10/1984 | Beard | |
| 6,768,364 B2 * | 7/2004 | Wang | H03B 27/00 327/238 |
| 7,321,640 B2 | 1/2008 | Milne et al. | |
| 7,612,621 B2 * | 11/2009 | Kim | H03K 5/13 327/156 |
| 7,733,984 B2 | 6/2010 | Baumgartner et al. | |
| 7,894,547 B2 | 2/2011 | Fortier et al. | |
| 8,139,700 B2 | 3/2012 | Beukema et al. | |
| 8,400,196 B2 * | 3/2013 | Kim | G11C 7/222 327/156 |
| 8,760,209 B2 * | 6/2014 | Schell | H03H 7/06 327/237 |
| 9,225,324 B2 | 12/2015 | Arcudia et al. | |
| 9,444,442 B2 | 9/2016 | Chandrasekaran et al. | |

(Continued)

OTHER PUBLICATIONS

Extended European Search Report for corresponding European Patent Application No. 19163050.8, dated Jul. 18, 2019, 8 pages.

*Primary Examiner* — Jeffery S Zweizig
(74) *Attorney, Agent, or Firm* — Lewis Roca Rothgerber Christie LLP (57) ABSTRACT

A system and method quadrature clock generation circuit includes an approximate quadrature clock generator and an I/Q correction circuit. The approximate quadrature clock generator has an input configured to receive an input signal and generate an approximate quadrature clock and an approximate in-phase clock using the input signal. The I/Q correction circuit is configured to receive the approximate quadrature clock at a first quadrature input and the approximate in-phase clock at a first in-phase input and output an improved quadrature clock at a first quadrature output and improved in-phase clock at a first in-phase output.

20 Claims, 10 Drawing Sheets

(56) References Cited

U.S. PATENT DOCUMENTS

| | | | |
|---|---|---|---|
| 9,484,900 B2 * | 11/2016 | Cohen | .................... H03K 5/135 |
| 2002/0003444 A1 | 1/2002 | Sasaki | |
| 2014/0002183 A1 | 1/2014 | Iyer et al. | |
| 2017/0063353 A1 | 3/2017 | Coteus et al. | |

* cited by examiner

FIG. 1

Related Art

FIG. 7B

COMPACT AND ACCURATE QUADRATURE CLOCK GENERATION CIRCUITS

CROSS-REFERENCE TO RELATED APPLICATION(S)

The present application claims priority to, and the benefit of, U.S. Provisional Patent Application No. 62/643,625, filed on, Mar. 15, 2018, the contents of which is incorporated herein by reference in its entirety.

BACKGROUND

Some embodiments of the present disclosure relate generally to quadrature clock generation.

Serial links include a transmitter connected to a receiver via a channel. In many cases the transmitter forwards a complimentary high-speed clock to the receiver in addition to any data. The receiver typically performs compensation for the clock and data signals to account for any skew introduced by the channel. Accurate de-skewing often uses a phase-interpolator which in turn, often uses a quadrature clock. A quadrature clock (Q) is a clock that is offset by 90 degrees from an in-phase clock (I).

Figure 1:
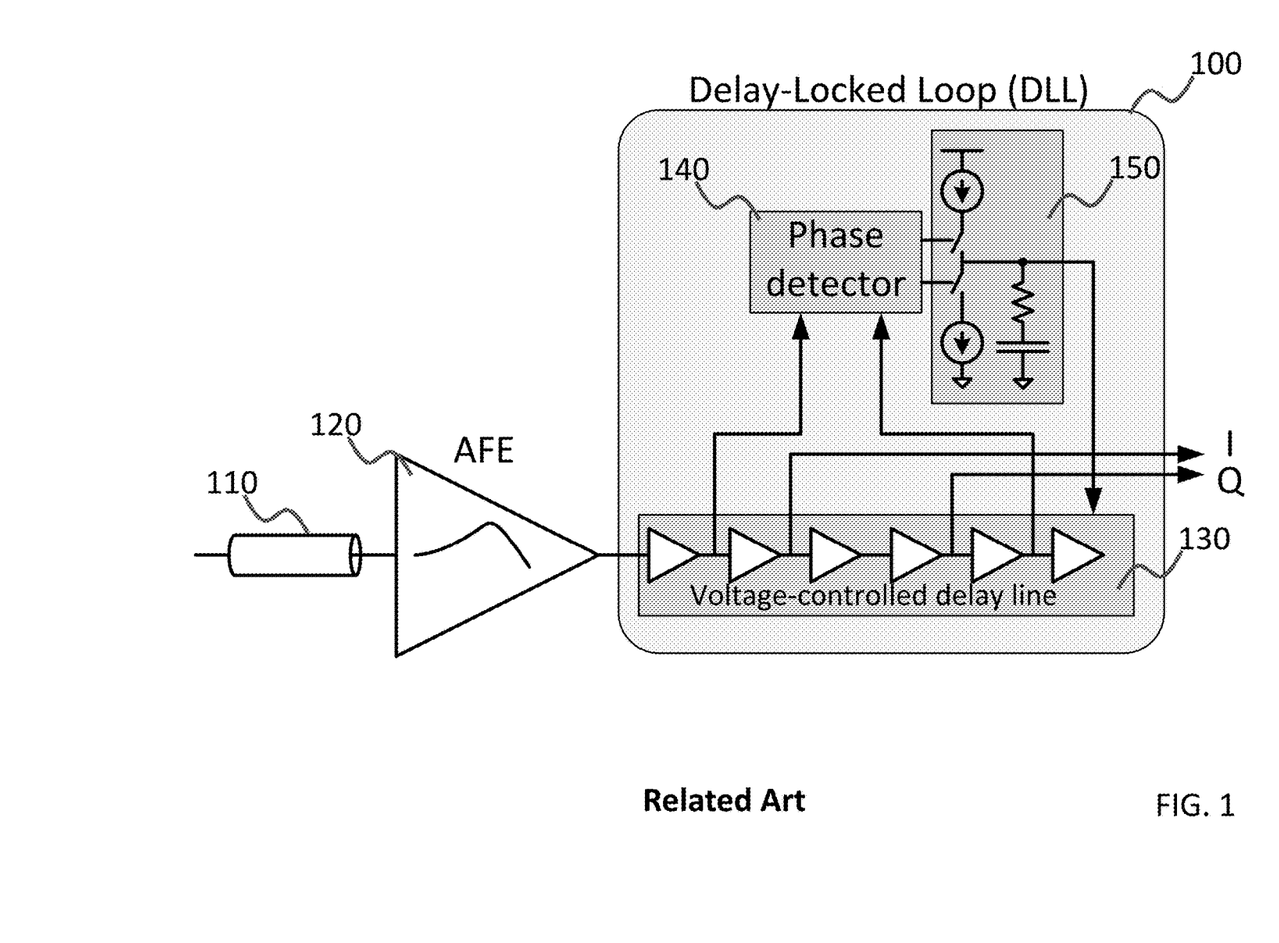
FIG. 1 depicts a related art receiver configured to generate a quadrature clock using a Delay-Locked Loop (DLL)

FIG. 1 depicts a related art receiver configured to generate a quadrature clock using a Delay-Locked Loop (DLL).

Referring to FIG. 1, related art systems have generally relied upon an analog front-end (AFE) 120 to amplify an incoming signal and a DLL 100 to generate the in-phase and quadrature clock components (e.g., I/Q). A signal is supplied by a transmitter via the channel 110 and received at an analog front end 120 of the receiver. The analog front end 120 may, for example, include one or more filtering and amplification stages. The DLL 100 receives the modified signal from the analog front end 120 and generates the in-phase component and quadrature component (I/Q) of the clock. The DLL 100 includes multiple components such as delay circuitry 130, a phase detector 140, and a charge pump 150. These components can take up a large area and consume a relatively high amount of power. Furthermore, the DLL 100 introduces a number of extra stages in the clock path which may increase jitter. Thus, an improved system and method that requires less power, space, and less stages in the clock path is desired.

The above information is only for enhancement of understanding of the background of embodiments of the present disclosure, and therefore may contain information that does not form the prior art.

SUMMARY

Some embodiments of the present disclosure provide a system and method for quadrature clock generation. In various embodiments, a quadrature clock generation circuit includes an approximate quadrature clock generator and a first I/Q correction circuit. In various embodiments, the approximate quadrature clock generator includes an input configured to receive an input signal and generate an approximate quadrature clock and an approximate in-phase clock using the input signal. In various embodiments, the first I/Q correction circuit is configured to receive the approximate quadrature clock at a first quadrature input and the approximate in-phase clock at a first in-phase input and output an improved quadrature clock at a first quadrature output and improved in-phase clock at a first in-phase output.

In various embodiments, the I/Q correction circuit includes a first injector buffer, a second injector buffer, a first resonator buffer, and a second resonator buffer. In various embodiments, the first injector buffer has an input connected to the first in-phase input and a first injector buffer output connected to the first in-phase output; the second injector buffer has an input connected to the first quadrature input and a second injector buffer output connected to the first quadrature output; the first resonator buffer is connected to the first quadrature output and the first in-phase output; and the second resonator buffer is connected to the first quadrature output and the first in-phase output.

In various embodiments, the approximate quadrature clock, improved quadrature clock, approximate in-phase clock, and improved in-phase clock are differential signals.

In various embodiments, the first injector buffer includes a first transistor and a second transistor, where: a gate of the first transistor is configured to receive a positive differential signal from the approximate in-phase clock; a gate of the second transistor is configured to receive a negative differential signal from the approximate in-phase clock; and a drain of the first transistor and a drain of the second transistor are connected to the first in-phase output. In various embodiments, the second injector buffer includes a third transistor and a fourth transistor, where: a gate of the third transistor is configured to receive a positive differential signal from the approximate quadrature clock; a gate of the fourth transistor is configured to receive a negative differential signal from the approximate quadrature clock; and a drain of the third transistor and a drain of the fourth transistor are connected to the first quadrature output. In various embodiments, the first resonator buffer includes a fifth transistor and a sixth transistor, where: a gate of the fifth transistor is connected to the drain of the fourth transistor; a drain of the fifth transistor is connected to the drain of the second transistor; a gate of the sixth transistor is connected to the drain of the third transistor; and a drain of the sixth transistor is connected to the drain of the first transistor. In various embodiments, the second resonator buffer includes a seventh transistor and a eighth transistor, where: a gate of the seventh transistor is connected to is connected to the drain of the second transistor; a drain of the seventh transistor is connected to the drain of the third transistor; a gate of the eighth transistor is connected to the drain of the first transistor; and a drain of the eighth transistor is connected to the drain of the fourth transistor.

In various embodiments, the first resonator buffer and the second resonator buffer each comprise a DC voltage gain adjustment, wherein the DC voltage gain adjustment modifies at least one of a gain at a peak frequency and a bandwidth around the peak frequency.

In various embodiments, the approximate quadrature clock generator includes a polyphase filter.

In various embodiments, the quadrature clock generation circuit further includes a second I/Q correction circuit configured to receive the improved quadrature clock at a second quadrature input and the improved in-phase clock at a second in-phase input and output an second improved quadrature clock at a second quadrature output and a second improved in-phase clock at a second in-phase output.

In various embodiments, the approximate quadrature generator includes an AC coupling circuit connected to the input; and a modified I/Q correction circuit where the modified I/Q correction circuit includes: a first injector buffer with an input connected to the first in-phase input and a first injector buffer output connected to the first in-phase output, wherein the first in-phase input further comprises a high-pass filter; a second injector buffer with an input connected to the first quadrature input and a second injector buffer output connected to the first quadrature output; a first resonator buffer connected to the first quadrature output and the first in-phase output; and a second resonator buffer connected to the first quadrature output and the first in-phase output.

In various embodiments, the I/Q correction circuit further includes a bias adjustment circuit configured to receive a bias current and adjust a peak frequency of the I/Q correction circuit.

In various embodiments, the I/Q correction circuit further comprises an injection strength adjustment for modifying at least one of a gain, a peak frequency, or a bandwidth.

In various embodiments, a method for generating a quadrature clock includes:

receiving a forwarded clock from a channel; generating an approximate in-phase clock and an approximate quadrature clock using an approximate quadrature generator; adjusting the approximate in-phase clock and the approximate quadrature clock using a first I/Q correction circuit to generate an improved in-phase clock and an improved quadrature clock; and outputting the improved in-phase clock and improved quadrature clock.

In various embodiments, generating the improved in-phase and quadrature clock includes: adjusting a phase difference between the approximate in-phase clock and approximate quadrature clock to be closer to 90 degrees; and amplifying the approximate in-phase clock and quadrature clock.

In various embodiments, the improved in-phase clock and the improved quadrature clock may be further adjusted using a second I/Q correction circuit to generate a further improved in-phase clock and further improved quadrature clock and outputting the improved in-phase clock and quadrature clock includes outputting the further improved in-phase and further improved quadrature clock.

In various embodiments, generating the improved in-phase and quadrature clock using the first I/Q correction circuit includes: receiving the approximate in-phase clock and the approximate quadrature clock; shifting the phase of each of the approximate in-phase clock and the approximate quadrature clock according to a reference phase shift; generating the improved quadrature clock by adding the phase shifted approximate in-phase clock with the approximate quadrature clock; generating the improved in-phase clock by subtracting the phase shifted approximate quadrature clock from the approximate in-phase clock; and outputting the improved quadrature clock and the improved in-phase clock.

In various embodiments, the approximate quadrature clock generator includes a polyphase filter.

In various embodiments, the approximate quadrature generator includes an AC coupling circuit connected to the input; and a modified I/Q correction circuit. In various embodiments, the modified I/Q correction circuit includes: a first injector buffer having a high-pass filter configured to generate an initial phase shift between the approximate in-phase clock and the approximate quadrature clock.

In various embodiments, a quadrature clock generation circuit includes an approximate quadrature clock generator configured to receive a forwarded clock from a channel and output an approximate in-phase clock and at least one I/Q correction circuit connected to the approximate clock generator and configured to: receive the approximate in-phase clock and the approximate quadrature clock; shift the phase of each of the approximate in-phase clock and the approximate quadrature clock according to a reference phase shift; generate an improved quadrature clock by adding the phase shifted approximate in-phase clock with the approximate quadrature clock; generate an improved in-phase clock by subtracting the phase shifted approximate quadrature clock from the approximate in-phase clock; and output the improved quadrature clock and the improved in-phase clock.

In various embodiments, the I/Q correction circuit includes: a first injector buffer with an input connected to the first in-phase input and a first injector buffer output connected to the first in-phase output; a second injector buffer with an input connected to the first quadrature input and a second injector buffer output connected to the first quadrature output; a first resonator buffer connected to the first quadrature output and the first in-phase output; and a second resonator buffer connected to the first quadrature output and the first in-phase output.

In various embodiments, the quadrature clock generation circuit further includes a second I/Q correction circuit configured to receive the improved quadrature clock at a second quadrature input and the improved in-phase clock at a second in-phase input and output an second improved quadrature clock at a second quadrature output and a second improved in-phase clock at a second in-phase output.

In various embodiments, the I/Q correction circuit further includes: a bias adjustment circuit configured to receive a bias current and adjust a peak frequency of the I/Q correction circuit; an injection strength adjustment for modifying at least one of a gain, a peak frequency, or a bandwidth; and wherein the first resonator buffer and the second resonator buffer each include a DC voltage gain adjustment, wherein the DC voltage gain adjustment modifies at least one of a gain at a peak frequency and a bandwidth around the peak frequency.

BRIEF DESCRIPTION OF THE DRAWINGS

Some embodiments can be understood in more detail from the following description taken in conjunction with the accompanying drawings, in which.

DETAILED DESCRIPTION

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

Embodiments of the present disclosure include a system and method for quadrature clock generation. In various embodiments, the system and method operates across a wide frequency range, is robust to component tolerances, and consumes less power and area than related art systems. In various embodiments, components of the system may also be used to correct phase mismatches present in related art quadrature clock generating systems (e.g., polyphase filters, DLLs). In various embodiments, the system and method generates approximate quadrature clocks. The amplitude and phase balance of the approximate quadrature clocks is then improved using one or more corrector circuits. Each corrector circuit may include one or more adjustment mechanisms that may be employed to tune the corrector circuit for increased performance in various frequency bands in the operating frequency range.

Figure 2:
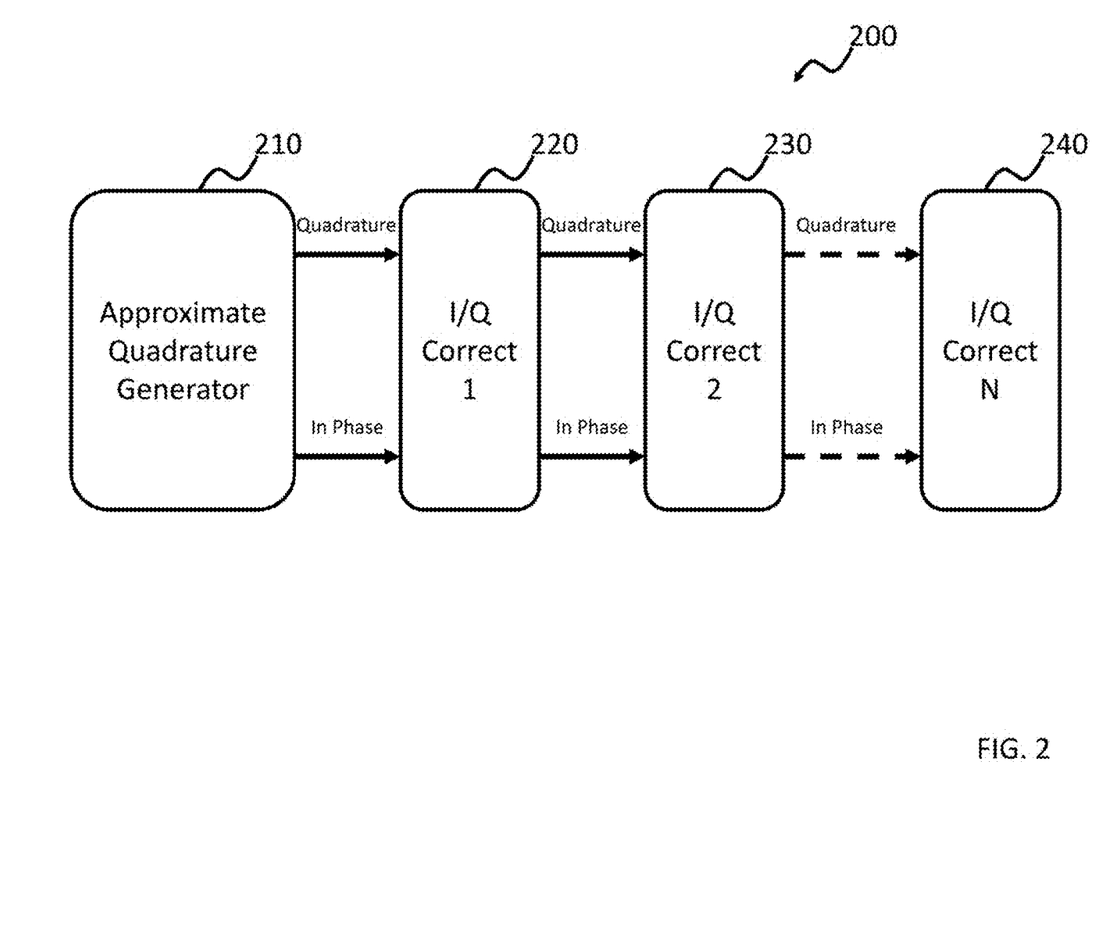
FIG. 2 depicts an example system for quadrature clock generation according to various embodiments.
Figure 3:
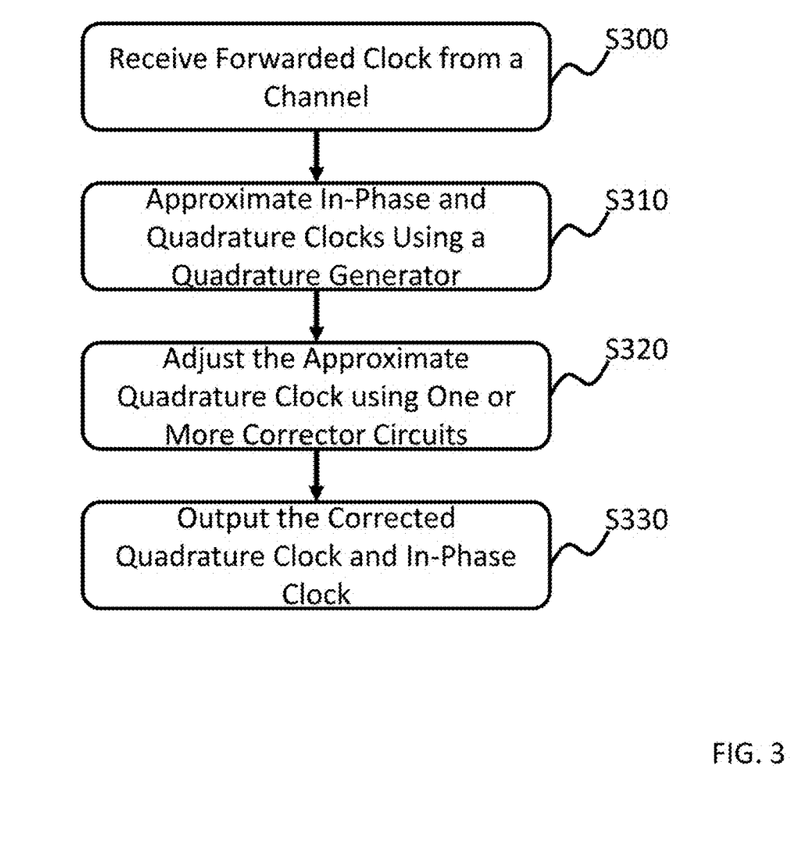
FIG. 3 depicts a block diagram of a method of generating a quadrature clock according to various embodiments.

FIG. 2 depicts an example system for quadrature clock generation according to various embodiments. FIG. 3 depicts a block diagram of a method of generating a quadrature clock according to various embodiments.

Referring to FIGS. 2 and 3, in various embodiments, a receiver may include a quadrature clock generation circuit 200 configured to receive an incoming signal (e.g. a forwarded clock) and output in-phase and quadrature clocks. The incoming signal is used to generate a quadrature clock and an in-phase clock. In various embodiments, the quadrature clock generation circuit 200 receives the incoming signal (S300). For example, the incoming signal may have been sent by a transmitter using a channel and received at quadrature clock generation circuit 200. However, in other embodiments, the signal may be received at the receiver by the analog front end which may modify, filter, and amplify the signal.

In various embodiments, the incoming signal may be provided to an approximate clock generator 210 which generates an in-phase clock and approximate quadrature clock (S310). For example, the approximate quadrature clock may be a clock that is phase shifted relative to an in-phase clock. In general, a quadrature clock should be equivalent to an in-phase clock shifted by 90 degrees, however, in various embodiments, the approximate quadrature generator can provide a phase shift that is lower or higher than 90 degrees. In various embodiments, the approximate quadrature clock generator 210 may be a pass-through (no approximate quadrature generator), an open-loop delay cell, a polyphase filter (e.g. a single-stage polyphase filter), or any other suitable quadrature clock approximation circuit. In various embodiments, the approximate quadrature clock generator 210 outputs an approximate quadrature clock (Q) and an approximate in-phase clock (I) to an I/Q correction circuit 220.

In various embodiments, the I/Q correction circuit 220 is configured to adjust the phase to improve the phase balance of the approximate quadrature (Q) clock and approximate in-phase clock (I) (i.e., such that the quadrature clock is closer to a 90 degree phase offset from the in-phase clock) (S320). In various embodiments, the I/Q correction circuit 220 may also adjust the gain (e.g. amplitude) of the I/Q clocks.

In various embodiments, multiple I/Q correction circuits may be used to further improve the phase balance and amplitude of the I/Q clocks. In various embodiments, the first I/Q correction circuit may provide the I/Q signal to one or more additional I/Q correction circuits 230, 240. Each of the I/Q correction circuits provides gain and an improved phase shift between the clocks (e.g., the quadrature clock is closer to being a 90 degree phase shift of the in-phase clock). In various embodiments, one to four I/Q correction circuits 220-240 may be used depending on the accuracy of the approximate quadrature clock generator 210, along with design goals and constraints. For example, each of the I/Q correction circuits 220-240 may be tuned for operation in different frequencies, with different bandwidths, and various DC gains as will be discussed below.

In various embodiments, the I and Q signals may be differential signals. Thus, the connections between the approximate quadrature clock generator 210 and the I/Q correction circuit 220 may include additional connections to support the differential signals. Similarly, the connections between the I/Q correction circuits 220, 230, 240 may also include compatibility for differential signal connections. The improved quadrature clock and in-phase clock may then be output for use (S330).

Figure 4A:
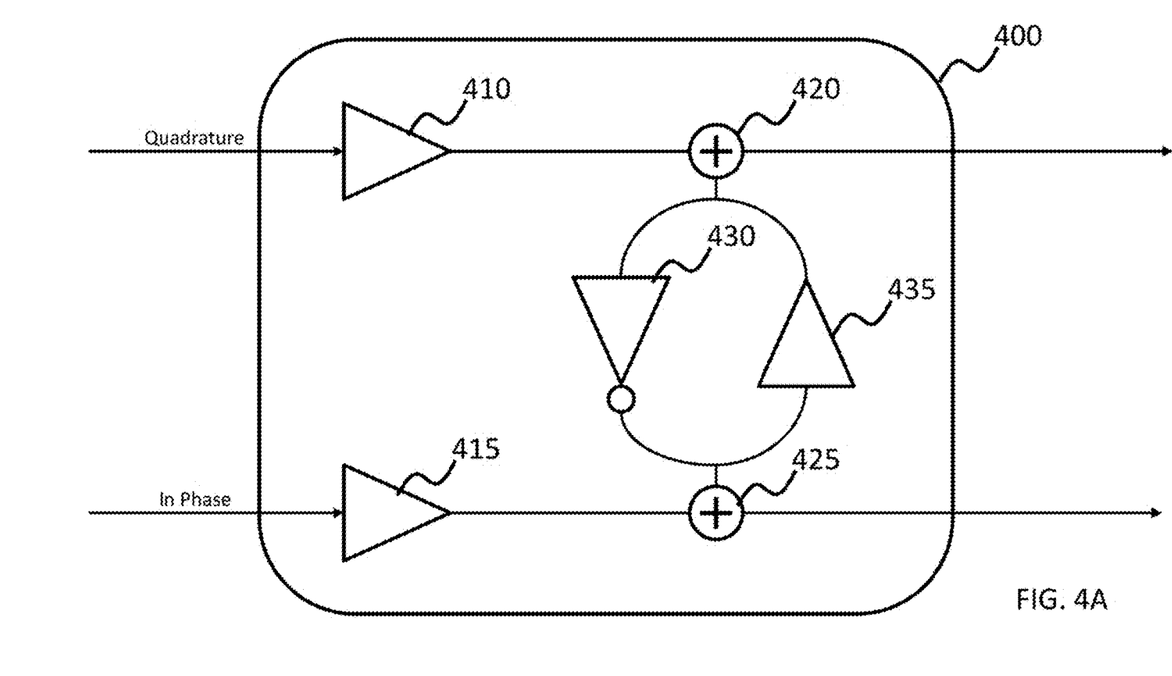
FIG. 4A depicts an example I/Q correction circuit according to various embodiments of this disclosure.
Figure 4B:
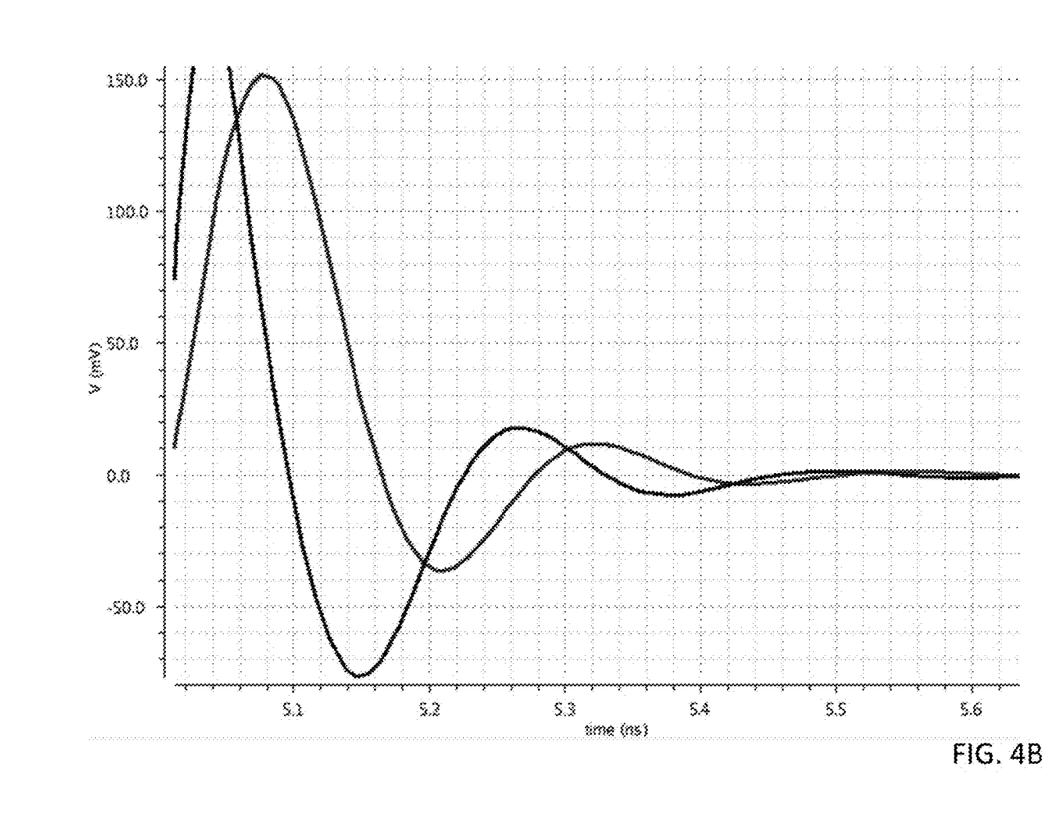
FIG. 4B depicts an example impulse response of an I/Q correction circuit according to various embodiments of this disclosure.
Figure 4C:
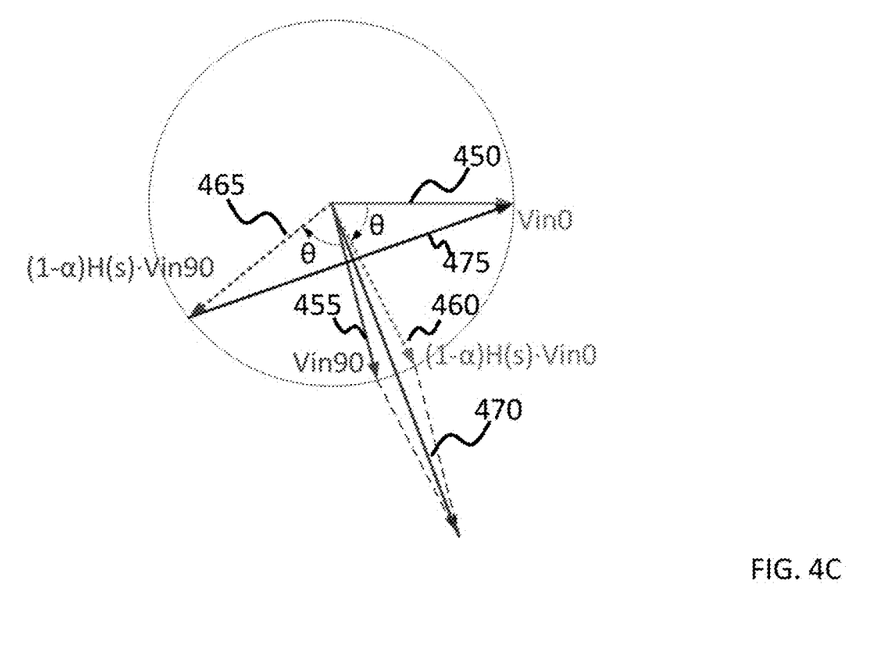
FIG. 4C depicts phase modification of the quadrature clocks by an I/Q correction circuit according to various embodiments of this disclosure.
Figure 4D:
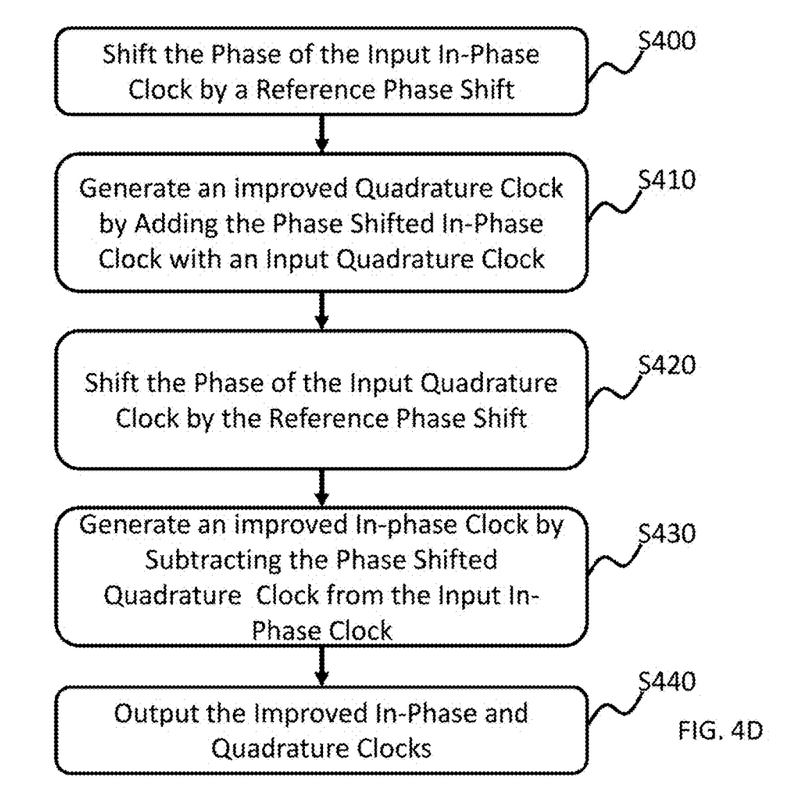
FIG. 4D depicts a method of modification of a quadrature clock by an I/Q correction circuit according to various embodiments of this disclosure.

FIG. 4A depicts an example I/Q correction circuit according to various embodiments of this disclosure. FIG. 4B depicts an example impulse response of an I/Q correction circuit according to various embodiments of this disclosure. FIG. 4C depicts phase modification of the quadrature clocks by an I/Q correction circuit according to various embodiments of this disclosure. FIG. 4D depicts a method of modification of the quadrature clocks by an I/Q correction circuit according to various embodiments of this disclosure.

Referring to FIG. 4A, in various embodiments an I/Q correction circuit 400 is configured to increase the amplitude of the incoming clock signals and improve their phase relationship. In various embodiments, the core of the I/Q correction circuit 400 that consists of resonator buffers 430 and 435, functions as a resonator. Each of the resonator buffers 430 and 435 introduces a phase shift θ of less than 90 degrees to its respective input. In various embodiments, the resonator has a resonant frequency that is approximately equal to the frequency of the unity-gain bandwidth of buffers 430 and 435. In various embodiments, the resonator's Q factor (e.g., quality factor) increases as θ (the phase shift of each stage at the resonant frequency) approaches 90 degrees.

In various embodiments, the I/Q correction circuit 400 includes injector buffers (e.g., amplifiers) 410, 415, adders 420, 425, and resonator that consists of resonator buffers 430, 435. The injector buffers receive the incoming I/Q signals, amplify them according to an injection strength (a), and provide the amplified signals to the adders 420, 425. In various embodiments, the injection strength a allows for the modification of gain and bandwidth of the I/Q correction circuit 400. For example, a higher value of a provides for higher gain at the peak, lower peak frequency, wider bandwidth around the peak, and less efficient I/Q correction (e.g., worse I/Q correction). Conversely, a lower value of a provides for a lower gain at the peak (e.g., peak frequency), a higher peak frequency, a narrower bandwidth around the peak, and more efficient I/Q correction (e.g., better I/Q correction). The value for a may range from 0 to 1 with typical values being between approximately 0.4-0.6.

The adders 420, 425 are connected to the resonator buffers 430, 435. The adders 420, 425 are used to add the output of one signal (e.g., the Q clock or the I clock) to the other signal. In various embodiments, the resonator buffers 430, 435 each have a transfer function of $(1-\alpha)H(s)$, where $(1-\alpha)$ is the strength of the resonator. In various embodiments, the first resonator buffer 430 may be in an inverting configuration whereas the second resonator buffer 435 may be in a non-inverting configuration.

In various embodiments, the DC voltage gain of each I/Q correction circuit 400 may be adjusted. For example, in various embodiments, a higher DC voltage gain may result in a higher gain at the peak, narrower bandwidth around the peak, and more efficient I/Q correction. Conversely, a lower DC voltage gain may result in lower gain at the peak, wider bandwidth around the peak, and less efficient I/Q correction. In various embodiments, the DC voltage gain may be approximately 2.

Referring to FIG. 4B, the impulse response resonator core 430 and 435 of the I/Q correction circuit 400 is depicted. As shown by FIG. 4B, the outputs resonate while eventually decaying to zero as time elapses.

Referring to FIGS. 4C and 4D, in various embodiments, the I/Q correction circuit 400 improves the incoming quadrature and in-phase signals by phase shifting and adding the incoming signals. For example, in various embodiments, the system may phase shifting the incoming in-phase signal 450 by θ to obtain signal 460 (S400) and add it to the incoming quadrature signal 455 to obtain an amplified and corrected quadrature signal 470 (S410). The system may likewise phase shift the incoming quadrature signal 455 by θ to obtain signal 465 (S420) and subtract it from the incoming in-phase signal 450 to obtain an amplified and corrected in-phase signal 475 (S430). The improved in-phase and quadrature clocks may then be forwarded to either the next stage or be the final output of the system (S440).

In various embodiments, the relationship between in-phase and quadrature inputs and in-phase and quadrature outputs is more formally and completely described by equations 1 and 2.

$$V_{out0} = \frac{\alpha H(s)}{1+(1-\alpha)^2 H^2(s)}(V_{in0} - (1-\alpha)H(s)V_{in90}) \quad (1)$$

$$V_{out90} = \frac{\alpha H(s)}{1+(1-\alpha)^2 H^2(s)}(V_{in90} + (1-\alpha)H(s)V_{in0}) \quad (2)$$

The coefficient $$\frac{\alpha H(s)}{1+(1-\alpha)^2 H^2(s)}$$

in equations (1) and (2) describes a common gain factor for in-phase and quadrature clocks. Since it does not affect their phase relationship, it has been omitted from diagrams in FIGS. 4C and 4D for simplicity. The second parts of equations (1) and (2) describe phase shifts and vector additions that lead to improved I/Q balance of the outputs compared to the inputs, as illustrated in FIGS. 4C and 4D.

As demonstrated by FIG. 4C, the output in-phase clock 470 and output quadrature clock 475 have been amplified and the phase shift between the in-phase and out of phase clocks 470, 475 has been improved (e.g. the phase shift from the in-phase clock 470 to the quadrature clock 475 is closer to 90 degrees). Use of multiple I/Q correction circuits in series may further improve the amplitude and phase alignment of the in-phase and quadrature components.

Figure 5:
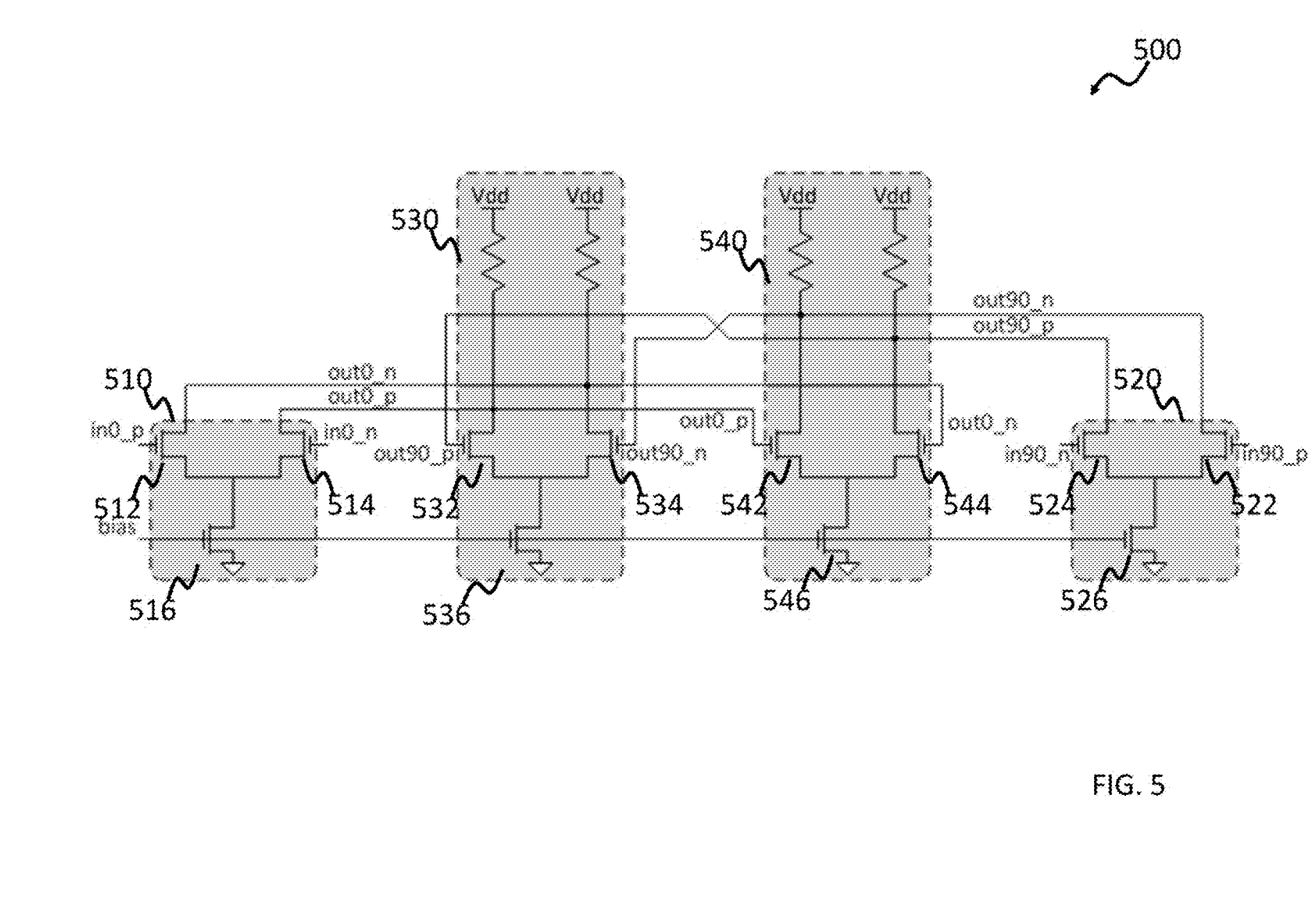
FIG. 5 depicts a circuit level diagram of a I/Q correction circuit according to various embodiments.

FIG. 5 depicts a circuit level diagram of an I/Q correction circuit according to various embodiments.

Referring to FIG. 5, in various embodiments, as described above, each I/Q correction circuit 500 may be configured to receive two differential clock signals (e.g., a quadrature clock and an in-phase clock) and output two improved differential clock signals (e.g., with increased amplitude and a phase offset closer to 90 degrees). In various embodiments, the I/Q correction circuit 500 includes a first injector buffer 510, a second injector buffer 520, a first resonator buffer 530, and a second resonator buffer 540.

In various embodiments, the I/Q correction circuit may receive a differential in-phase component (in0_p, in0_n) at an in-phase input connected to first injector buffer 510 and a differential quadrature component (in90_p, in90_n) at a quadrature input connected to the second injector buffer 520.

In various embodiments, the first injector buffer 510 receives the differential in-phase component in0_p, in0_n at a gate of a first transistor 512 and a gate of a second transistor 514. In various embodiments, the drain of the first transistor 512 provides the in-phase output voltage out0_n for output and to the first resonator buffer 530 and the second resonator buffer 540. In various embodiments, the drain of the second transistor 514 may provide the in-phase output voltage out0_p and is also connected to the first resonator buffer 530 and the second resonator buffer 540.

Similarly, in various embodiments, the second injector buffer 520 receives the differential quadrature component in90_p, in90_n at a gate of a third transistor 522 and a gate of a forth transistor 524. In various embodiments, the drain of the third transistor 522 provides the quadrature output voltage out90_n for output and to the first resonator buffer 530 and the second resonator buffer 540. In various embodiments, the drain of the forth transistor 524 may provide the quadrature output voltage out90_p and is also connected to the first resonator buffer 530 and the second resonator buffer 540.

In various embodiments, the first resonator buffer 530 includes a fifth transistor 532 and a sixth transistor 534. In various embodiments, the gate of the fifth transistor 532 is connected to the quadrature output voltage out90_p. Similarly, the gate the sixth transistor 534 is connected to the quadrature output voltage out90_n. In various embodiments, the drain of the fifth transistor 532 is connected to the in-phase output voltage out0_p and the drain of the sixth transistor 534 is connected to the in-phase output voltage out0_n.

In various embodiments, the second resonator buffer 5430 includes a seventh transistor 542 and an eighth transistor 544. In various embodiments, the gate of the seventh transistor 542 is connected to the in-phase output voltage out0_p and the gate the eighth transistor 544 is connected to the in-phase output voltage out0_n. In various embodiments, the drain of the seventh transistor 532 is connected to the quadrature output voltage out90_n and the drain of the eighth transistor 544 is connected to the quadrature output voltage out90_p.

In various embodiments, each of the first injector buffer 510, second injector buffer 520, first resonator buffer 530, and second resonator buffer 540 may include a bias circuit such as a bias transistor 516, 526, 536, 546. The bias transistor may receive a bias voltage that may be used generate a current to adjust the performance parameters of the I/Q correction circuit 500. For example, in various embodiments, the bias may be used to shift the peak frequency (and optimum correction frequency) of the I/Q correction circuit because the resonant frequency is proportional to transconductance, and transconductance increases with an increase in bias current. Thus, a higher bias current may result in a higher peak frequency. The bias current may be different in each I/Q correction circuit to provide for a broad-band frequency response or each stage may include the same bias current to improve performance at a target frequency band. Thus, in various embodiments, the bias current, injector strength a, and DC voltage gain allows for the adjustment and tuning of the I/Q correction circuit.

Figures 6A, 6B:
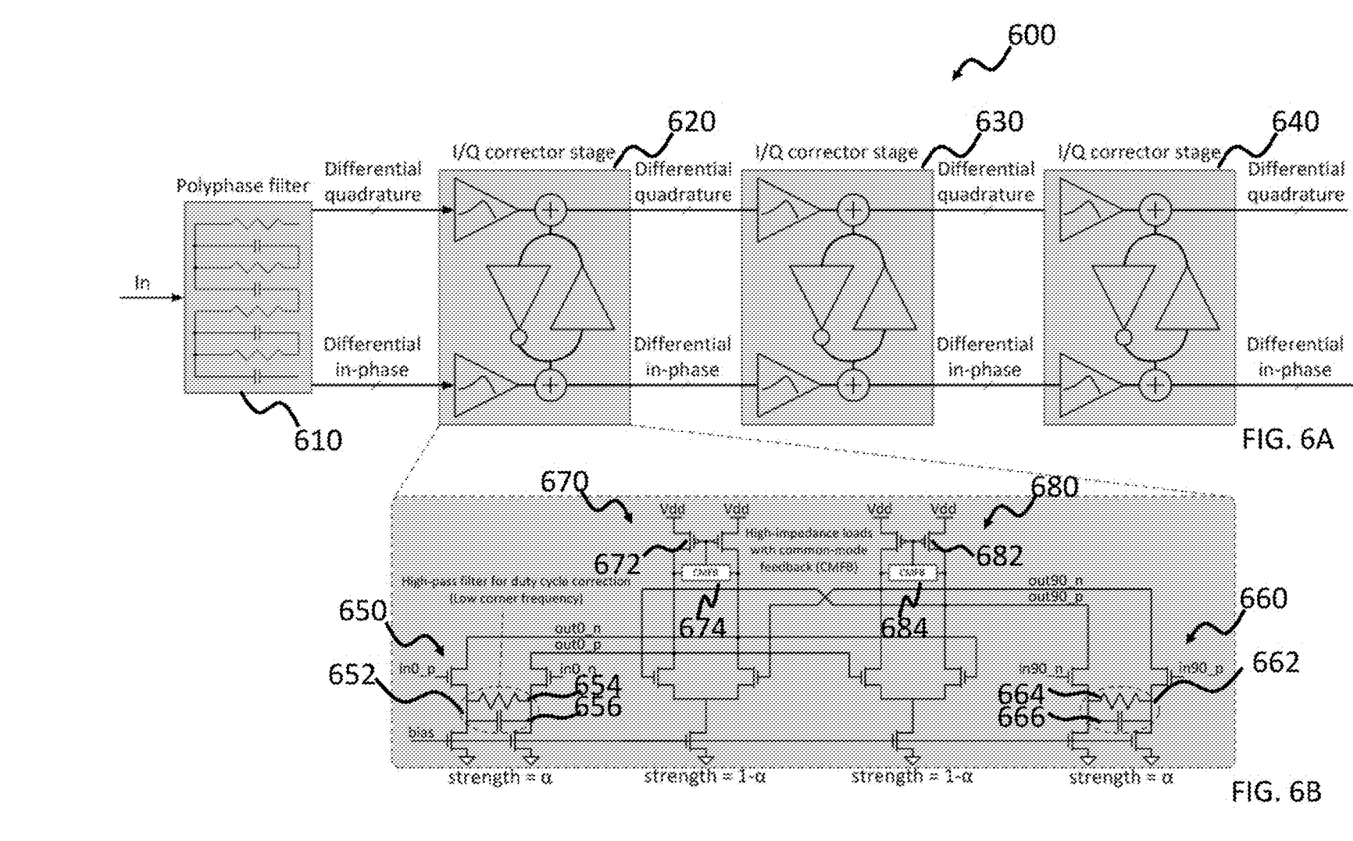
FIG. 6A depicts an example system for quadrature clock generation that uses a polyphase filter to generate approximate quadrature clocks according to various embodiments.
FIG. 6B depicts an example I/Q correction circuit of FIG. 6A according to various embodiments.

FIG. 6A depicts an example system for quadrature clock generation that uses a polyphase filter to generate the approximate quadrature clocks according to various embodiments. FIG. 6B depicts an example I/Q correction circuit of FIG. 6A according to various embodiments.

Referring to FIG. 6A, in various embodiments, a system for quadrature clock generation 600 may include a polyphase filter 610 and three I/Q correction stages 620, 630, 640. In various embodiments, the polyphase filter is configured to generate a differential quadrature clock and a differential in-phase clock as described above. In various embodiments, the I/Q correction circuits may be modified for improved performance.

Referring to FIG. 6B, in various embodiments, the I/Q correction circuits 620-640 may be modified for improved performance. For example, in various embodiments, the first injector buffer 650 and the second injector buffer 660 may each include a high pass filter 652, 662 for duty cycle correction. In various embodiments, the high pass filters 652, 662 may include a resistor 654, 664 and a capacitor 656, 666 in parallel. The high pass filters 652, 662 may be configured with a low corner frequency (e.g., a low cutoff frequency), ideally much lower than the target operating frequency.

In various embodiments, the I/Q correction circuit 610 may also include modified resonator buffers 670, 680. For example, each of the resonator buffers 670, 680 may also include high-impedance loads (transistors 672, 682) with common mode feedback 674, 684 to improve the DC gain of the buffers, thereby improving the quality of I/Q correction.

Figure 7A:
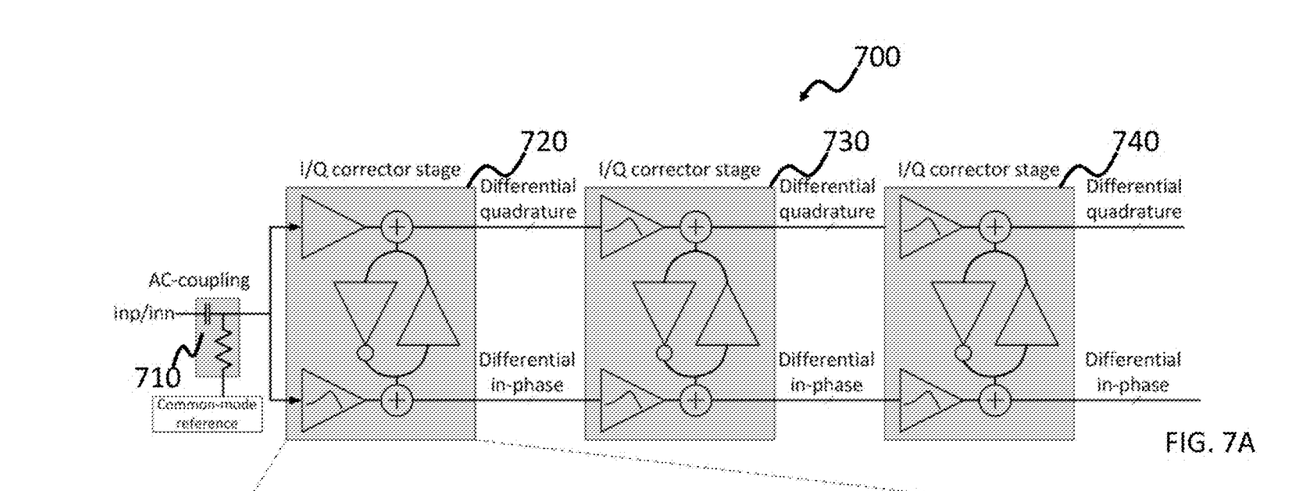
FIG. 7A depicts an example system for quadrature clock generation that uses a modified I/Q correction circuit to generate approximate quadrature clocks according to various embodiments.
Figure 7B:
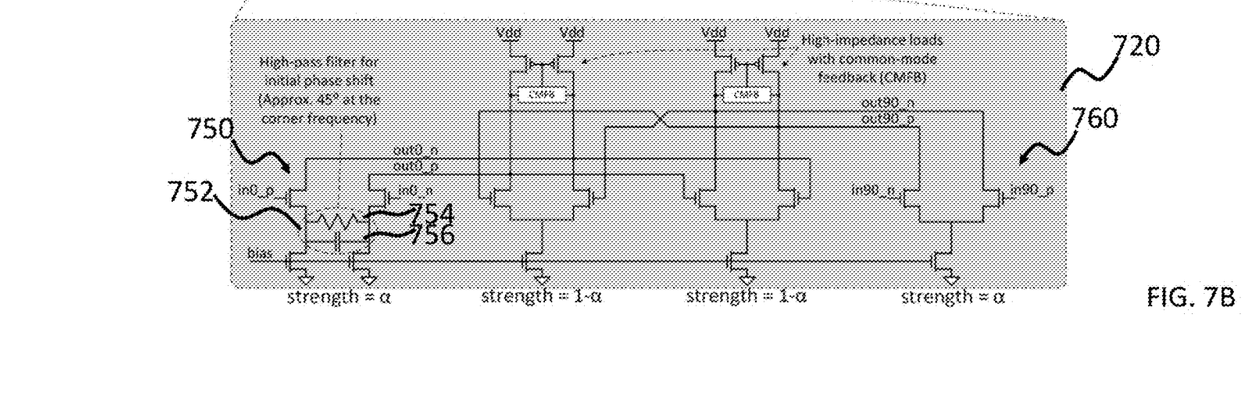
FIG. 7B depicts an example modified I/Q correction circuit of FIG. 7A according to various embodiments.

FIG. 7A depicts an example system for quadrature clock generation that uses an AC coupling circuit and a modified I/Q correction circuit to generate an approximate quadrature clock according to various embodiments. FIG. 7B depicts an example modified I/Q correction circuit of FIG. 7A according to various embodiments.

Referring to FIG. 7A, in various embodiments, the system for quadrature clock generation may include a modified I/Q corrector circuit to provide an initial phase shift and then one or more additional (unmodified) I/Q corrector circuits. For example, in various embodiments, the quadrature clock system 700 includes an AC coupling circuit 710, a modified I/Q correction circuit 720, and I/Q corrector circuits 730, 740. In various embodiments, the AC coupling circuit 710 is configured to receive an input signal (e.g., forwarded clock from the serial link transmitter) and DC-shift it to a common-mode reference. For example, in various embodiments, the AC coupling circuit 710 may include a capacitor 712 and a resistor 714 coupled to the common-mode reference. Although depicted with a single input, in various embodiments, the AC coupling circuit 710 may be configured for use with differential signals. In various embodiments, the common mode referenced input signal may be provided to the modified I/Q corrector stage 720. The modified I/Q corrector stage 720 is configured to add a phase shift to one of the input signals. The I/Q corrector stages 720, 730, and 740 may then adjust the phase shift so that it approaches the desired 90 degree quadrature clock phase shift.

Referring to FIG. 7B, in various embodiments, an I/Q correction circuit 720 may be modified to provide an initial phase shift for the input signal. For example, in various embodiments, the first injector buffer 750 may include a high pass filter 752 and the second injector buffer 760 does not include a high pass filter including a first resistor 754 and a first capacitor 756. The first high pass filter 732 may cause the output of the in-phase injector buffer to have a phase shift relative to the output of the quadrature injector buffer. For example, in some embodiments, the high pass filter 732 may introduce an initial phase shift of approximately 45 degrees. The additional I/Q correction circuits 720, 730, and 740 then bring the in-phase and quadrature components closer to the desired 90 degree phase shift.

In the preceding description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A quadrature clock generation circuit comprising:
approximate quadrature clock generator with an input configured to receive an input signal and generate an approximate quadrature clock and an approximate in-phase clock using the input signal; and
a first I/Q correction circuit configured to receive the approximate quadrature clock at a first quadrature input and the approximate in-phase clock at a first in-phase input and output an improved quadrature clock at a first quadrature output and improved in-phase clock at a first in-phase output, wherein the first I/Q correction circuit comprises:
a first resonator buffer connected to the first quadrature output and the first in-phase output, wherein the first resonator buffer is in an inverting configuration; and a second resonator buffer connected to the first quadrature output and the first in-phase output, wherein the second resonator buffer is in a non-inverting configuration.

2. The quadrature clock generation circuit of claim 1, wherein the first I/Q correction circuit further comprises:
a first injector buffer with an input connected to the first in-phase input and a first injector buffer output connected to the first in-phase output; and
a second injector buffer with an input connected to the first quadrature input and a second injector buffer output connected to the first quadrature output.

3. The quadrature clock generation circuit of claim 2, wherein the approximate quadrature clock, improved quadrature clock, approximate in-phase clock, and improved in-phase clock are differential signals.

4. The quadrature clock generation circuit of claim 3, wherein the:
the first injector buffer comprises a first transistor and a second transistor, wherein:
a gate of the first transistor is configured to receive a positive differential signal from the approximate in-phase clock;
a gate of the second transistor is configured to receive a negative differential signal from the approximate in-phase clock; and
a drain of the first transistor and a drain of the second transistor are connected to the first in-phase output;
the second injector buffer comprises a third transistor and a fourth transistor, wherein:
a gate of the third transistor is configured to receive a positive differential signal from the approximate quadrature clock;
a gate of the fourth transistor is configured to receive a negative differential signal from the approximate quadrature clock; and
a drain of the third transistor and a drain of the fourth transistor are connected to the first quadrature output;
the first resonator buffer comprises a fifth transistor and a sixth transistor, wherein:
a gate of the fifth transistor is connected to is connected to the drain of the fourth transistor;
a drain of the fifth transistor is connected to the drain of the second transistor;
a gate of the sixth transistor is connected to the drain of the third transistor; and
a drain of the sixth transistor is connected to the drain of the first transistor; and
the second resonator buffer comprises a seventh transistor and a eighth transistor, wherein:
a gate of the seventh transistor is connected to is connected to the drain of the second transistor;
a drain of the seventh transistor is connected to the drain of the third transistor;
a gate of the eighth transistor is connected to the drain of the first transistor; and
a drain of the eighth transistor is connected to the drain of the fourth transistor.

5. The quadrature clock generation circuit of claim 1, wherein the first resonator buffer and the second resonator buffer each comprise a DC voltage gain adjustment, wherein the DC voltage gain adjustment modifies at least one of a gain at a peak frequency and a bandwidth around the peak frequency.

6. The quadrature clock generation circuit of claim 1, wherein the approximate quadrature clock generator comprises a polyphase filter.

7. The quadrature clock generation circuit of claim 1, further comprising a second I/Q correction circuit configured to receive the improved quadrature clock at a second quadrature input and the improved in-phase clock at a second in-phase input and output an second improved quadrature clock at a second quadrature output and a second improved in-phase clock at a second in-phase output.

8. The quadrature clock generation circuit of claim 1, wherein the approximate quadrature clock generator comprises:
an AC coupling circuit connected to the input; and
a modified I/Q correction circuit comprising:
a first injector buffer with an input connected to the first in-phase input and a first injector buffer output connected to the first in-phase output, wherein the first in-phase input further comprises a high-pass filter;
a second injector buffer with an input connected to the first quadrature input and a second injector buffer output connected to the first quadrature output;
a first resonator buffer connected to the first quadrature output and the first in-phase output; and
a second resonator buffer connected to the first quadrature output and the first in-phase output.

9. The quadrature clock generation circuit of claim 1, wherein the first I/Q correction circuit further comprises a bias adjustment circuit configured to receive a bias current and adjust a peak frequency of the first I/Q correction circuit.

10. The quadrature clock generation circuit of claim 1, wherein the first I/Q correction circuit further comprises an injection strength adjustment for modifying at least one of a gain, a peak frequency, or a bandwidth.

11. A method of generating a quadrature clock comprising:
receiving a forwarded clock from a channel;
generating an approximate in-phase clock and an approximate quadrature clock using an approximate quadrature clock generator;
adjusting the approximate in-phase clock and the approximate quadrature clock using a first I/Q correction circuit to generate an improved in-phase clock and an improved quadrature clock, wherein the first I/Q correction circuit comprises:
a first resonator buffer connected to a first quadrature output and a first in-phase output, wherein the first resonator buffer is in an inverting configuration; and
a second resonator buffer connected to the first quadrature output and the first in-phase output, wherein the second resonator buffer is in a non-inverting configuration; and
outputting the improved in-phase clock and improved quadrature clock.

12. The method of generating a quadrature clock of claim 11, wherein generating the improved in-phase and quadrature clock comprises:
adjusting a phase difference between the approximate in-phase clock and approximate quadrature clock to be closer to 90 degrees; and
amplifying the approximate in-phase clock and quadrature clock.

13. The method of generating a quadrature clock of claim 11, further comprising:
adjusting the improved in-phase clock and the improved quadrature clock using a second I/Q correction circuit to generate a further improved in-phase clock and further improved quadrature clock; and wherein outputting the improved in-phase clock and quadrature clock comprises outputting the further improved in-phase and further improved quadrature clock.

14. The method of generating a quadrature clock of claim 11, wherein generating the improved in-phase and improved quadrature clock using the first I/Q correction circuit comprises:
receiving the approximate in-phase clock and the approximate quadrature clock;
shifting a phase of each of the approximate in-phase clock and the approximate quadrature clock according to a reference phase shift;
generating the improved quadrature clock by adding the phase shifted approximate in-phase clock with the approximate quadrature clock;
generating the improved in-phase clock by subtracting the phase shifted approximate quadrature clock from the approximate in-phase clock; and
outputting the improved quadrature clock and the improved in-phase clock.

15. The method of generating a quadrature clock of claim 11, wherein the approximate quadrature clock generator comprises a polyphase filter.

16. The method of generating a quadrature clock of claim 11, wherein the approximate quadrature clock generator comprises:
an AC coupling circuit connected to the channel; and
a modified I/Q correction circuit comprising; and
a first injector buffer comprising a high-pass filter configured to generate an initial phase shift between the approximate in-phase clock and the approximate quadrature clock.

17. A quadrature clock generation circuit comprising:
an approximate quadrature clock generator configured to receive a forwarded clock from a channel and output an approximate in-phase clock and an approximate quadrature clock; and
at least one I/Q correction circuit connected to the approximate quadrature clock generator and configured to:
receive the approximate in-phase clock and the approximate quadrature clock;
shift a phase of each of the approximate in-phase clock and the approximate quadrature clock according to a reference phase shift;
generate an improved quadrature clock by adding the phase shifted approximate in-phase clock with the approximate quadrature clock;
generate an improved in-phase clock by subtracting the phase shifted approximate quadrature clock from the approximate in-phase clock; and
output the improved quadrature clock and the improved in-phase clock.

18. The quadrature clock generation circuit of claim 17, wherein the I/Q correction circuit comprises:
a first injector buffer with an input connected to a first in-phase input and a first injector buffer output connected to the first in-phase output;
a second injector buffer with an input connected to a first quadrature input and a second injector buffer output connected to a first quadrature output;
a first resonator buffer connected to the first quadrature output and the first in-phase output; and
a second resonator buffer connected to the first quadrature output and the first in-phase output.

19. The quadrature clock generation circuit of claim 17, further comprising a second I/Q correction circuit configured to receive the improved quadrature clock at a second quadrature input and the improved in-phase clock at a second in-phase input and output an second improved quadrature clock at a second quadrature output and a second improved in-phase clock at a second in-phase output.

20. The quadrature clock generation circuit of claim 18, wherein the I/Q correction circuit further comprises:
a bias adjustment circuit configured to receive a bias current and adjust a peak frequency of the I/Q correction circuit;
an injection strength adjustment for modifying at least one of a gain, a peak frequency, or a bandwidth; and
wherein the first resonator buffer and the second resonator buffer each comprise a DC voltage gain adjustment, wherein the DC voltage gain adjustment modifies at least one of a gain at a peak frequency and a bandwidth around the peak frequency.

* * * * *